United States Patent
Chang (10) Patent No.: US 11,621,170 B2
(45) Date of Patent: Apr. 4, 2023

(54) WAFER PROCESSING METHOD (71) Applicant: DISCO CORPORATION, Tokyo (JP)

(72) Inventor: Karen Chang, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/386,042

(22) Filed: Jul. 27, 2021

(65) Prior Publication Data

US 2022/0051897 A1 Feb. 17, 2022

(30) Foreign Application Priority Data

Aug. 13, 2020 (JP) .............................. JP2020-136681

(51) Int. Cl.
*H01L 21/304* (2006.01)
*H01L 21/02* (2006.01)
*B24B 7/22* (2006.01)

(52) U.S. Cl.
CPC ............ *H01L 21/304* (2013.01); *B24B 7/228* (2013.01); *H01L 21/02021* (2013.01); *H01L 21/02087* (2013.01)

(58) Field of Classification Search
None
See application file for complete search history.

(56) References Cited

U.S. PATENT DOCUMENTS

| 6,095,899 A * | 8/2000 | Elmar | B24D 7/10 |
| | | | 451/28 |
| 6,267,648 B1 * | 7/2001 | Katayama | H01L 21/02021 |
| | | | 451/41 |
| 2018/0342398 A1 * | 11/2018 | Sekiya | H01L 21/6836 |

FOREIGN PATENT DOCUMENTS

JP          2000173961 A       6/2000

\* cited by examiner

*Primary Examiner* — Stephanie P Duclair
(74) *Attorney, Agent, or Firm* — Greer Burns & Crain, Ltd.

(57) ABSTRACT

A processing method for a wafer having a chamfered portion at a peripheral edge includes a holding step of holding the wafer by a holding table, and a chamfer removing step of rotating the holding table while causing a first cutting blade to cut into the peripheral edge of the wafer while supplying a cutting liquid from a first cutting liquid supply nozzle to cut the peripheral edge of the wafer. In the chamfer removing step, a second cutting unit is positioned at a position adjacent to the first cutting unit at such a height that a second cutting blade does not make contact with the wafer and on the side of the center of the wafer as compared to the first cutting unit, and the cutting liquid is supplied from a second cutting liquid supply nozzle.

2 Claims, 7 Drawing Sheets

WAFER PROCESSING METHOD

BACKGROUND OF THE INVENTION

Field of the Invention

The present invention relates to a processing method for a disk-shaped wafer having a chamfered portion at the periphery.

Description of the Related Art

For example, as disclosed in Japanese Patent Laid-open No. 2000-173961, as a countermeasure against generally-called a sharp edge after grinding a back surface of a wafer, a technique of removing a chamfered portion on a front surface side of the wafer before grinding has been widely known.

The removal of the chamfered portion is conducted by cutting a peripheral edge portion of the wafer by a cutting blade rotated at high speed. During the processing, a cutting liquid is continuously supplied to a processing point and a surface of the cutting blade, to remove cutting swarf and to cool the cutting blade.

SUMMARY OF THE INVENTION

Cutting swarf generated by cutting at the time of removal of a chamfered portion is taken into a cutting liquid supplied continuously, and spreads on an upper surface (a surface on the upper side during the processing) of a wafer, whereby the cutting swarf adhered to a wide range of an upper surface of the wafer.

When the wafer is dried during processing, therefore, the cutting swarf would firmly adhere to devices on the upper surface of the wafer, and there is a fear that the cutting swarf cannot be removed by cleaning after removing the chamfered portion.

Then, if the cutting swarf remains firmly adhering to electrodes on the devices, there is a high possibility of defective bonding in the later bonding step or damaging of the devices by the cutting swarf firmly adhering the devices.

Accordingly, it is an object of the present invention to provide a novel wafer processing method for removing a chamfered portion at a peripheral portion of a wafer.

In accordance with an aspect of the present invention, there is provided a processing method for a wafer having a chamfered portion at a peripheral edge. The processing method includes a preparation step of preparing a cutting apparatus, the cutting apparatus including a holding table that holds the wafer, a first cutting unit having a first cutting blade for cutting the wafer held by the holding table, and a first cutting liquid supply nozzle for supplying a cutting liquid to the first cutting blade, and a second cutting unit having a second cutting blade for cutting the wafer held by the holding table, and a second cutting liquid supply nozzle for supplying the cutting liquid to the second cutting blade, a holding step of holding the wafer by the holding table, and a chamfer removing step of rotating the holding table while causing the first cutting blade to cut into the peripheral edge of the wafer at least to a grinding finish thickness of the wafer while supplying the cutting liquid from the first cutting liquid supply nozzle to cut the peripheral edge of the wafer, thereby removing the chamfered portion in a region reaching the grinding finish thickness, after the holding step is carried out. In the chamfer removing step, the second cutting unit is positioned at a position adjacent to the first cutting unit at such a height that the second cutting blade does not make contact with the wafer and on the side of a center of the wafer as compared to the first cutting unit, and the cutting liquid is supplied from the second cutting liquid supply nozzle.

Preferably, the processing method further includes a grinding step of grinding a back surface of the wafer to thin the wafer to the grinding finish thickness, after the chamfer removing step is carried out.

According to one mode of the present invention, the cutting liquid containing cutting swarf after jetted in the first cutting unit can be effectively prevented from moving toward the center side of the wafer, by the cutting liquid jetted in the second cutting unit and the action of rotation of the wafer. Further, during processing of the chamfer removing step, the front surface of the wafer can be cleaned by the cutting liquid jetted in the second cutting unit, and firm adhesion of the cutting swarf onto the devices on the front surface due to drying of the wafer can also be prevented effectively.

In addition, according to one mode of the present invention, since the chamfered portion on the front surface side of the wafer has been removed before the grinding step, formation of a sharp edge can be prevented.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
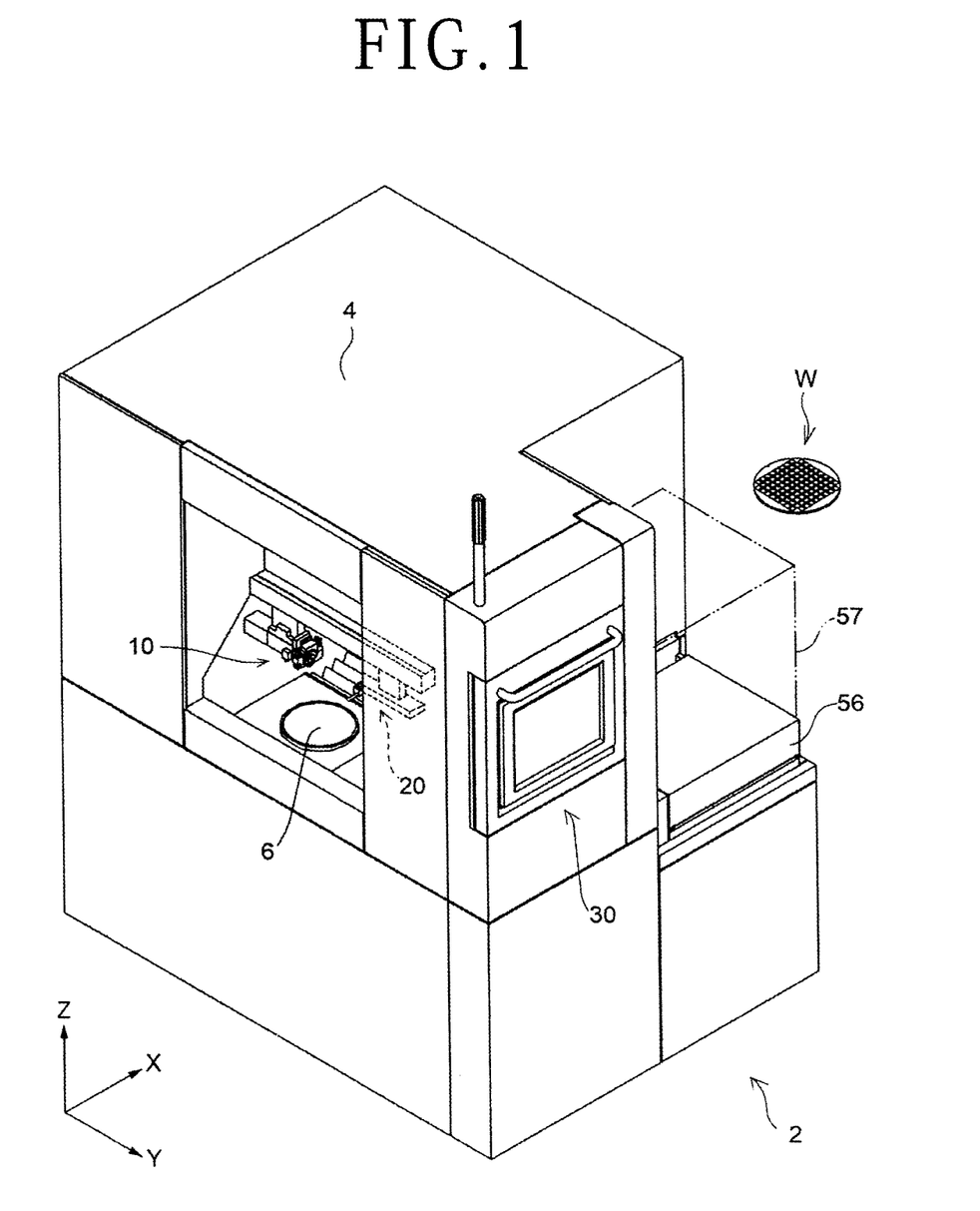
FIG. 1 is an external appearance perspective view depicting a cutting apparatus.

An embodiment of the present invention will be described below referring to the attached drawings. FIG. 1 is an external appearance perspective view depicting a cutting apparatus 2 according to the present embodiment.

As illustrated in FIG. 1, a configuration section of the cutting apparatus 2 is accommodated in an external cover 4 formed by combining a plurality of panels.

The cutting apparatus 2 has a holding table 6 for holding a wafer as a workpiece. The holding table 6 is configured to be rotatable in a θ direction with a Z-axis as a center, by a rotational drive mechanism (not illustrated) provided on a lower side thereof. In addition, the holding table 6 is configured to be movable in an X-axis direction which is a processing feeding direction, by a processing feeding mechanism (not illustrated) provided on a lower side thereof.

The cutting apparatus 2 has a facing type cutting mechanism in which a first cutting unit 10 and a second cutting unit 20 are disposed to face each other in a Y-axis direction. Such a cutting apparatus 2 having a facing type cutting mechanism is also called dual dicer. The first cutting unit 10 and the second cutting unit 20 are configured to be each movable in the Y-axis direction and the Z-axis direction.

The cutting apparatus 2 has a cassette mount base 56 on which to mount a cassette 57 accommodating a plurality of wafers W therein. The cassette mount base 56 is configured to be movable in an upward-downward direction (Z-axis direction).

The cutting apparatus 2 has a touch panel type display monitor 30. An operator can input operation instructions for the apparatus through the display monitor 30, and an operating status of the apparatus is displayed on the display monitor 30.

Figure 2:
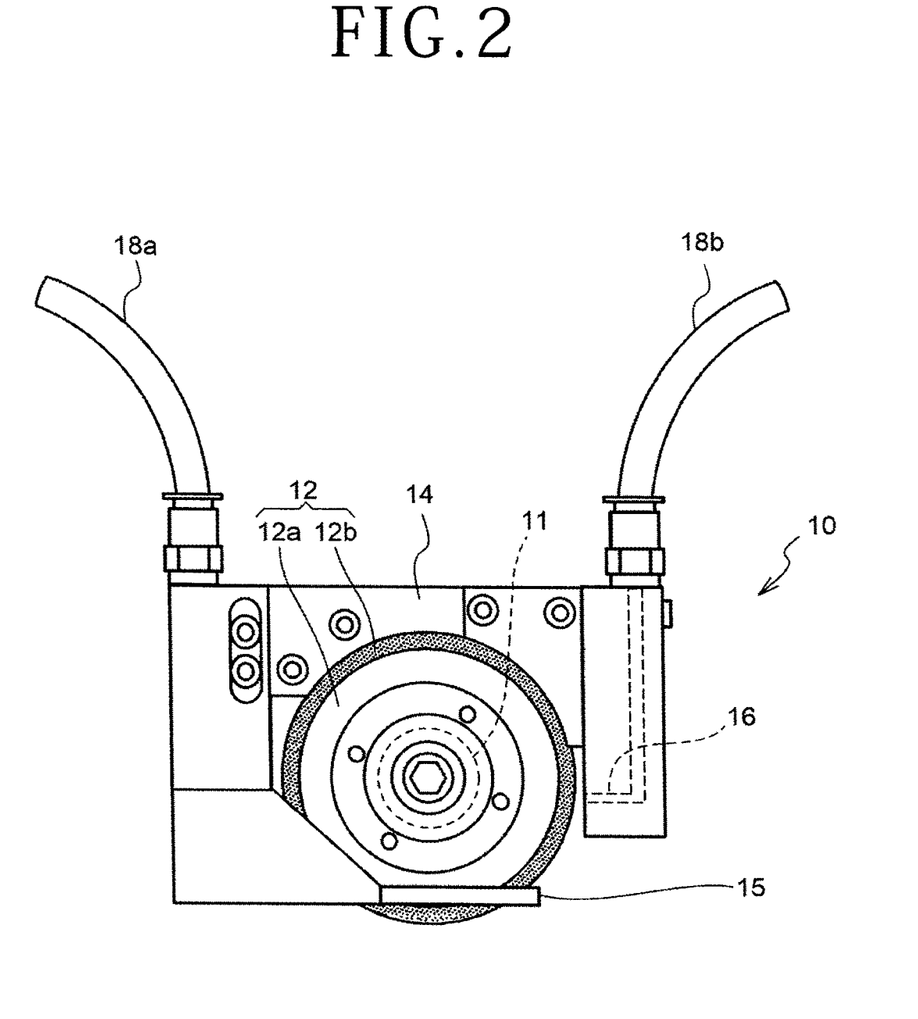
FIG. 2 is a diagram for explaining a configuration of a first cutting unit.

FIG. 2 is a diagram for explaining the configuration of the first cutting unit 10. Note that the configuration of the second cutting unit 20 (FIG. 1) is similar to the configuration of the first cutting unit 10, so that description of the configuration of the second cutting unit 20 is omitted.

The first cutting unit 10 includes a first cutting blade 12 fixed to a spindle 11 rotationally driven by a motor (not illustrated), and a blade cover 14 covering the periphery of the first cutting blade 12, and a cutting edge of the first cutting blade 12 projects toward the lower side of the blade cover 14. The blade cover 14 is provided with a blade cooler nozzle 15 for supplying a cutting liquid such as pure water to side surfaces of a lower portion of the first cutting blade 12, and a shower nozzle 16 for supplying the cutting liquid toward a peripheral edge portion of the first cutting blade 12 from a radial directionally outer side of the first cutting blade 12.

The blade cooler nozzle 15 and the shower nozzle 16 are supplied with the cutting liquid from a cutting liquid supply source (not illustrated) through cutting liquid supply lines 18a and 18b, respectively. During processing, the cutting liquid is continuedly supplied to the blade cooler nozzle 15 and the shower nozzle 16, and the cutting liquid is jetted from each of the nozzles.

As illustrated in FIG. 2, the first cutting blade 12 is configured by a hub type blade in which a cutting edge 12b is formed by electrodeposition on a base 12a (hub base) formed of aluminum, or a cutting blade in the form in which a base is absent and a cutting edge is fixed by a flange.

Figure 6A:
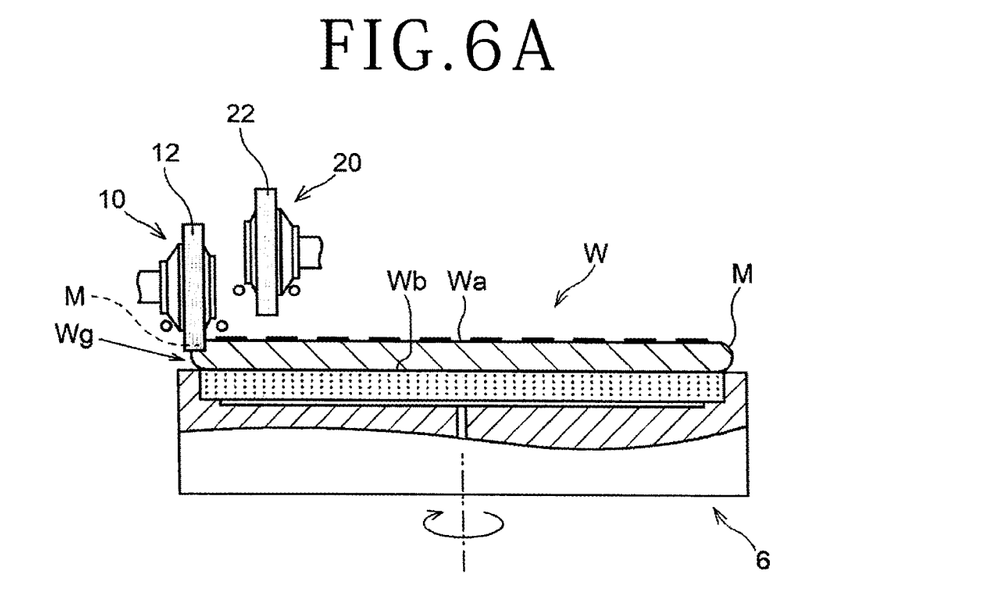
FIG. 6A is a diagram for explaining a chamfer removing step.
Figure 6B:
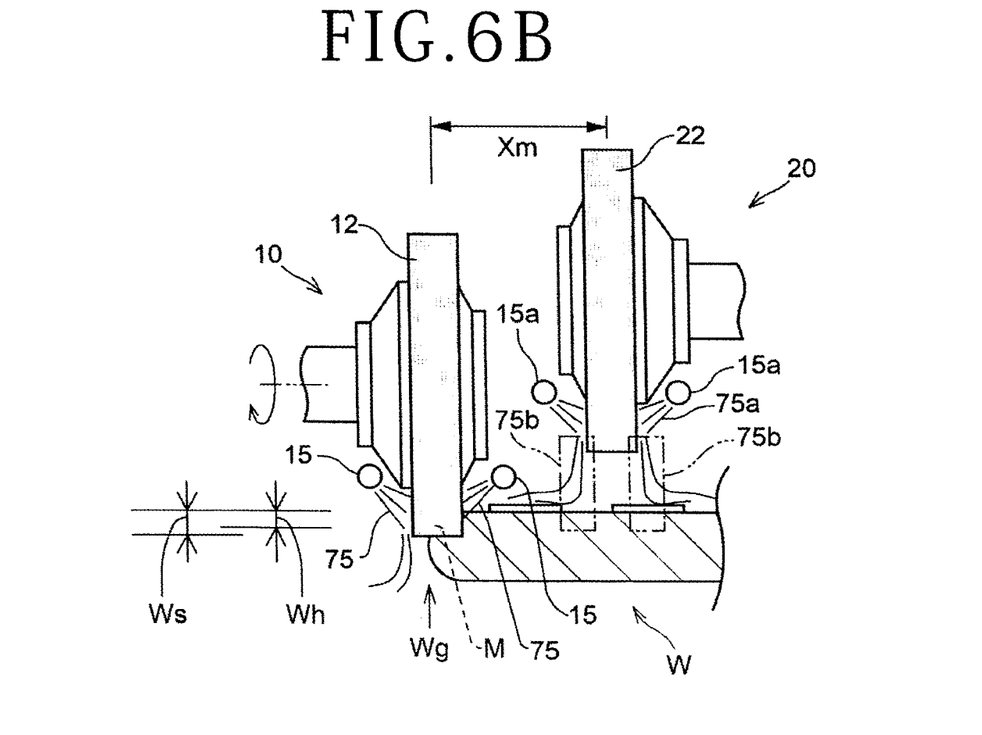
FIG. 6B is a diagram for explaining layout of first and second cutting units.

As depicted in FIG. 6B, the blade cooler nozzles 15 are disposed on both sides in the axial direction of the first cutting blade 12, whereby the first cutting blade 12 is interposed between the two blade cooler nozzles 15. From each of the blade cooler nozzles 15, the cutting liquid 75 is jetted toward side surfaces of a lower portion of the first cutting blade 12, to cool the first cutting blade 12 and cool the processing point.

Figure 7:
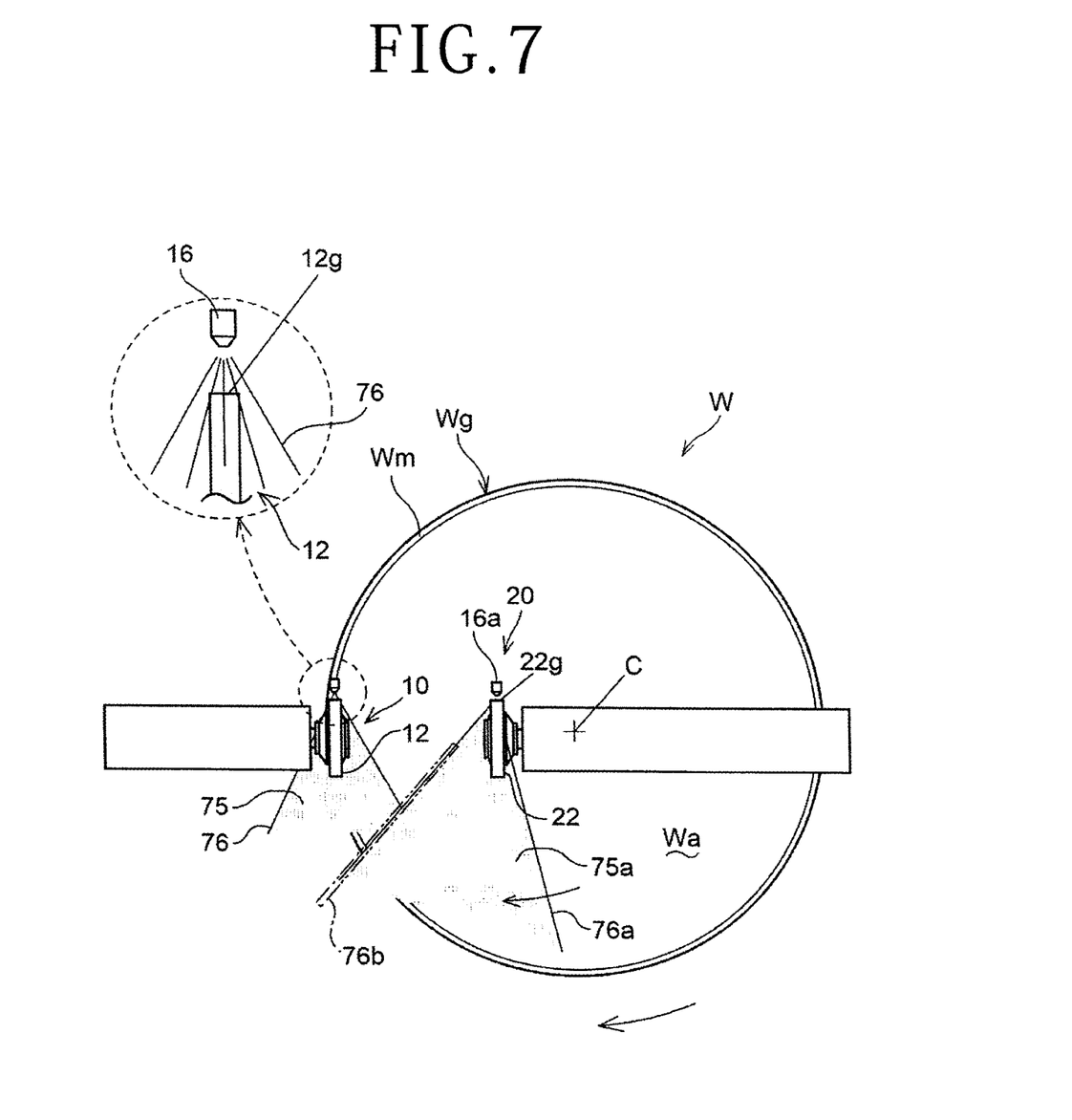
FIG. 7 is a diagram for explaining the manner of a cutting liquid on a front surface of a wafer.

As depicted in the enlarged part of FIG. 7, the shower nozzle 16 is disposed at a position substantially central in the thickness direction of the first cutting blade 12 and on a radial directionally outer side of the peripheral edge 12g of the first cutting blade 12. From the shower nozzle 16, the cutting liquid 76 is jetted from a radial directionally outer side of the first cutting blade 12 toward the center of the first cutting blade 12, to cool the first cutting blade 12 and to cool the processing point.

Note that while a configuration in which both the blade cooler nozzle 15 and the shower nozzle 16 are provided has been described in the above-mentioned example, the present invention can be carried out also in a configuration in which either one of the nozzles is provided, or in a configuration in which only one blade cooler nozzle 15 is provided.

Figure 3:
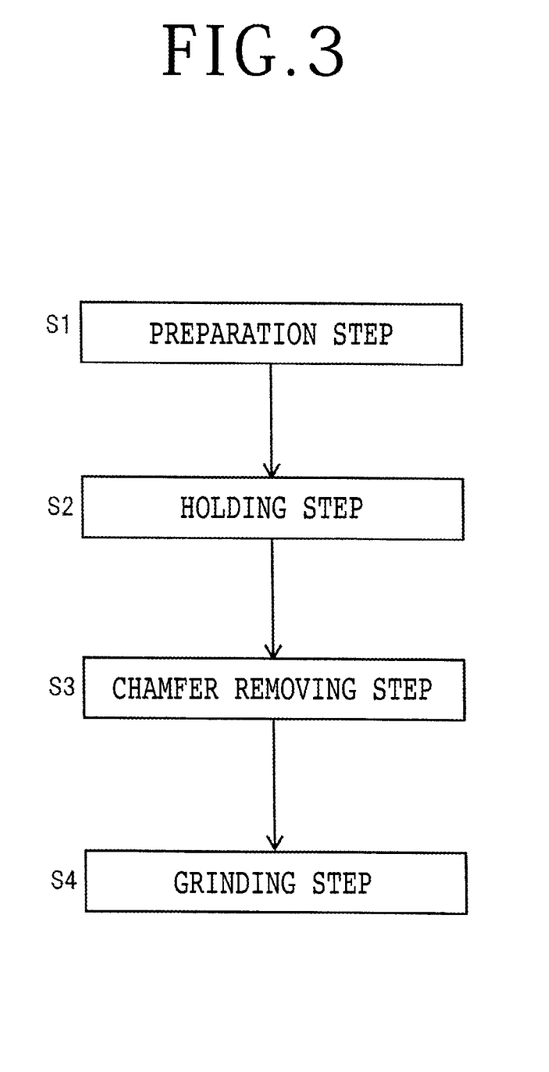
FIG. 3 is a flow chart depicting each step of a wafer processing method.

Next, an example of the wafer processing method according to the present invention by use of the above-mentioned apparatus configuration will be described. In the example that follows, steps are carried out in the order of the flow chart depicted in FIG. 3.

<Preparation Step S1>

Figure 4:
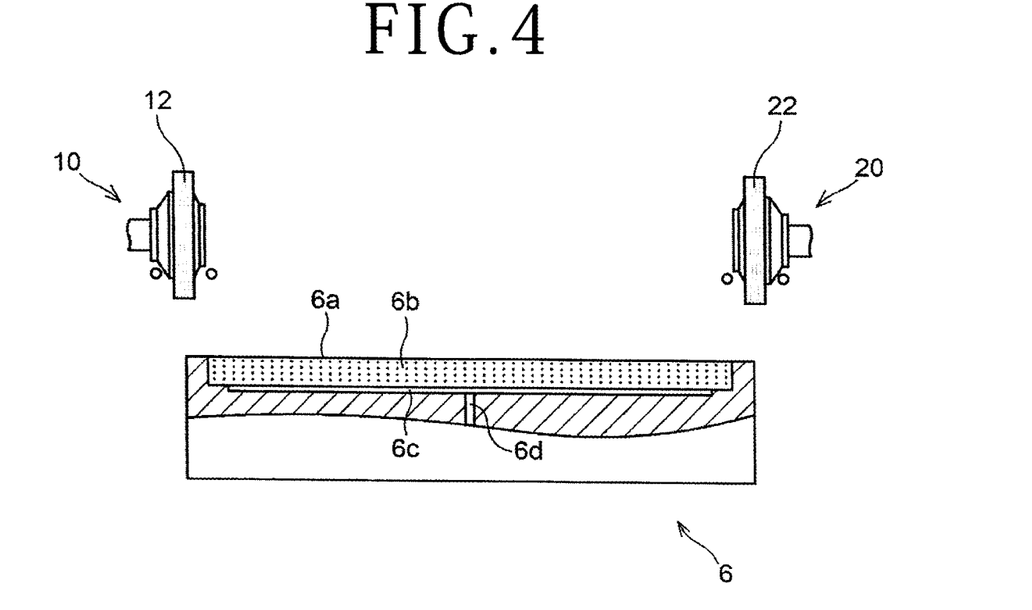
FIG. 4 is a diagram for explaining a preparation step.

As depicted in FIGS. 1 and 4, a preparation step S1 is a step of preparing the cutting apparatus 2 including the holding table 6 for holding the wafer, the first cutting unit 10, and the second cutting unit 20.

The holding table 6 has a porous plate 6b forming a suction holding surface 6a, and a base 6c to which the porous plate 6b is fixed. The base 6c is formed with a suction passage 6d connected to a suction source (not illustrated), and by sucking through the suction passage 6d, a negative pressure is formed at the suction holding surface 6a. Note that a specific configuration of the holding table 6 is not limited to the above-mentioned, and a configuration of holding only peripheral edge of the wafer may be adopted.

<Holding Step S2>

Figure 5:
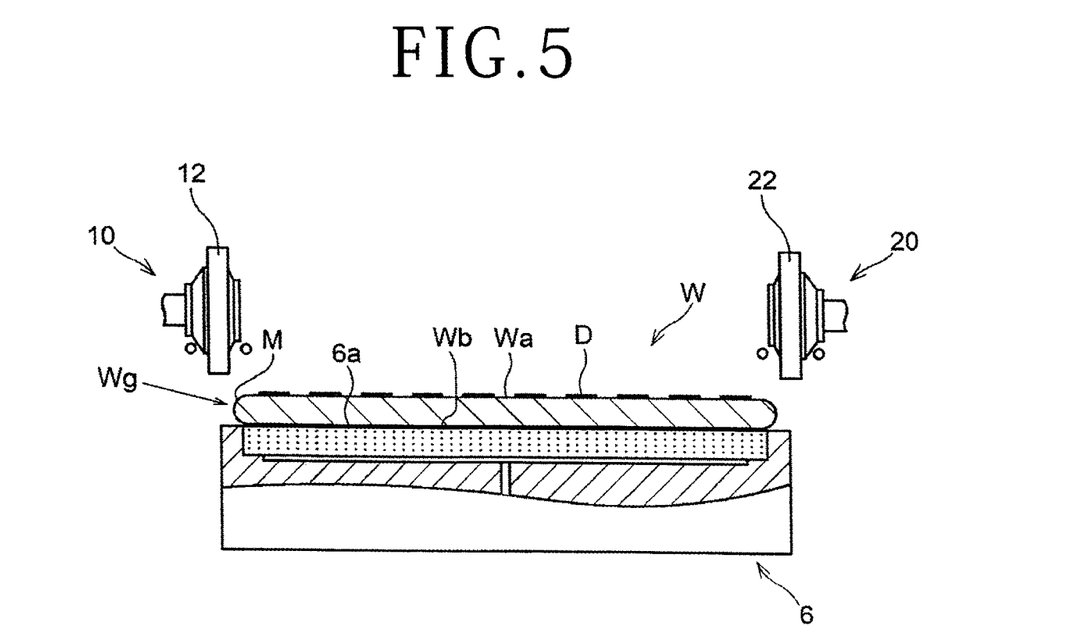
FIG. 5 is a diagram for explaining a holding step.

A holding step S2 is a step of holding the wafer W by the suction holding surface 6a of the holding table 6, as depicted in FIG. 5.

The front surface Wa side of the wafer W formed with devices D is exposed to the upper side, the back surface Wb of the wafer W is attached to a tape T, and the wafer w is suction held on the holding table 6 through the tape T.

A peripheral edge Wg of the wafer W is formed with a chamfered portion M, and in a chamfer removing step described later, the chamfered portion M is scheduled to be removed from the front surface Wa side of the wafer W to a predetermined depth. As a result, a sharp edge is not formed, upon thinning to a grinding finish thickness by grinding the back surface Wb thereafter.

<Chamfer Removing Step S3>

A chamfer removing step S3 is a step of rotating the holding table 6 while causing the first cutting blade 12 to cut into the peripheral edge Wg of the wafer W while supplying the cutting liquid 75 in the first cutting unit 10, to remove the chamfered portion M at a predetermined depth Ws of the peripheral edge Wg of the wafer W, as depicted in FIGS. 6A and 6B.

As illustrated in FIG. 6B, the predetermined depth Ws to which the chamfered portion M is removed is a depth of equal to or more than the grinding finish thickness Wh in a grinding step to be performed later. As a result, formation of a sharp edge in the grinding step performed later is prevented.

With the chamfered portion M removed, the peripheral edge Wg of the wafer W is formed with a series of circumferential groove Wm, as depicted in FIG. 7.

As illustrated in FIG. 6B, during processing for removing the chamfered portion M, the cutting liquid 75 is jetted from the blade cooler nozzles 15 toward side surfaces of a lower portion of the first cutting blade 12 in the first cutting unit 10.

The cutting liquid 75 made to collide on the first cutting blade 12 flows downward along the side surfaces of the first cutting blade 12, in which process the first cutting blade 12 and the processing point are cooled. The cutting swarf generated by cutting is washed away together with the cutting liquid 75.

Further, as depicted in FIG. 7, the cutting liquid 76 is jetted toward a peripheral edge 12g of the first cutting blade 12 from the shower nozzle 16 in the first cutting unit 10.

The cutting liquid 76 made to collide on the first cutting blade 12 mainly spread in a fan shape with a region of contact with the first cutting blade 12 as a starting point, and, in this spreading process, the first cutting blade 12 and the processing point are cooled. The cutting swarf generated by cutting is washed away together with the cutting liquid 76. Note that the cutting liquid 76 spreading in a fan shape on the front surface Wa of the wafer W in FIG. 7 includes the cutting liquid 75 from the blade cooler nozzles 15.

Then, as illustrated in FIGS. 6A, 6B, and 7, in the process of removal of the chamfered portion M by the first cutting unit 10, the second cutting unit 20 is positioned at a position adjacent to the first cutting unit 10 at such a height that a second cutting blade 22 does not make contact with the wafer W and on the side of the center of the wafer W as compared to the first cutting unit 10, and the cutting liquids 75a and 76a are supplied from the nozzles.

Specifically, first, the second cutting unit 20 is moved to a position in the vicinity of the first cutting unit 10 at which a predetermined spacing is secured between the second cutting unit 20 and the first cutting unit 10 such that they do not make contact with each other. For example, the second cutting unit 20 is disposed at a position nearest to the first cutting unit 10. In this case, a minimum inter-blade distance Xm such that the first cutting blade 12 and the second cutting blade 22 are closest is realized.

In addition, the second cutting unit 20 is disposed on the side nearer to the center of the wafer W than the first cutting unit 10, namely, is disposed between the first cutting unit 10 and the center C of the wafer W.

Further, the height position of the second cutting unit 20 is set such that the second cutting blade 22 does not make contact with the wafer W.

Then, as depicted in FIG. 6B, in the second cutting unit 20, a cutting liquid 75a is jetted from blade cooler nozzles 15a toward side surfaces of a lower portion of the second cutting blade 22.

The cutting liquid 75a made to collide on the second cutting blade 22 collides against side surfaces of the second cutting blade 22, flows downward, and by this flow a liquid barrier 75b of the cutting liquid 75a is formed.

By this liquid barrier 75b, the cutting liquid 75 jetted in the first cutting unit 10 can be prevented from moving to the center side of the wafer W, whereby cutting swarf contained in the cutting liquid 75 can be prevented from moving toward the center side of the wafer W. Note that by the barrier 75b depicted in FIG. 6B, movement of the cutting liquid 76 jetted from the shower nozzle 16 of the first cutting unit 10 depicted in FIG. 7 can also be prevented.

Further, as illustrated in FIG. 7, in the second cutting unit 20, a cutting liquid 76a is jetted from a shower nozzle 16a toward a peripheral edge 22g of the second cutting blade 22.

The cutting liquid 76a made to collide on the second cutting blade 22 mainly spreads in a fan shape between the first cutting unit 10 and the center C of the wafer W, with a region of contact with the second cutting blade 22 as a starting point, whereby a liquid barrier 76b can be formed.

By this liquid barrier 76b, the cutting liquids 75 and 76 jetted in the first cutting unit 10 can be prevented from moving toward the center side of the wafer W, and the cutting swarf contained in the cutting liquids 75 and 76 can be prevented from moving toward the center side of the wafer W.

In addition, as depicted in FIG. 7, since the wafer W is rotated in the process of removing the chamfered portion M, the cutting liquids 75a and 76a on the surface of the wafer W flow in the direction of spacing away from the center of the wafer W according to the rotation of the wafer W, and the liquid barrier 76b can also be formed at a position spaced away from the center of the wafer W. Note that, in the present embodiment depicted in FIG. 7, the wafer W is rotated clockwise in plan view, and the first cutting unit 10 is disposed in the vicinity of the position of 9 o'clock.

In this way, the cutting liquids 75 and 76 containing the cutting swarf can be effectively prevented from moving toward the center side of the wafer W after jetted in the first cutting unit 10. In addition, during the processing of the chamfer removing step, the front surface Wa of the wafer W can be washed by the cutting liquids 75a and 76a jetted in the second cutting unit 20, and firm adhesion of the cutting swarf onto the devices D on the front surface Wa due to drying of the wafer W can be effectively prevented.

<Grinding Step S4>

Figure 8:
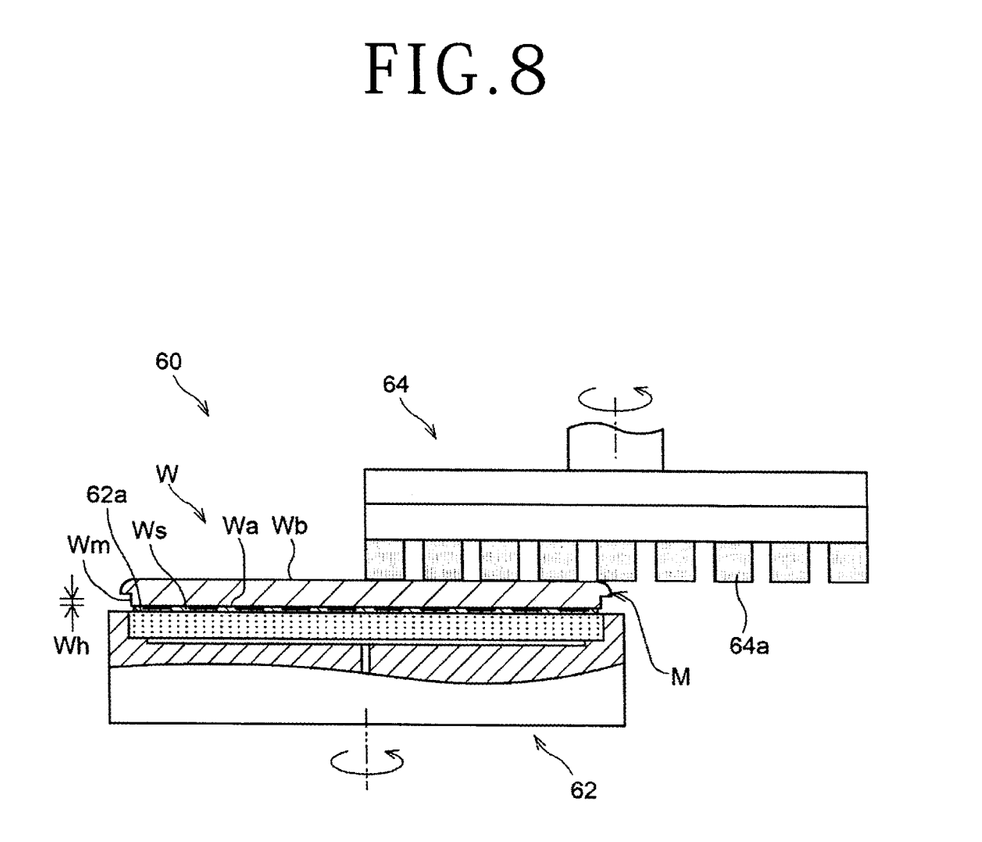
FIG. 8 is a diagram for explaining a grinding step.

A grinding step 4 is a step of grinding the back surface Wb of the wafer W to thin the wafer W to a grinding finish thickness Wh, as depicted in FIG. 8.

A grinding apparatus 60 depicted in FIG. 8 includes a holding table 62 that suction hold the wafer W and is rotated, and a grinding wheel 64 having grindstones 64a for grinding the back surface Wb of the wafer W.

A protective sheet Ws for protecting the devices and the like on the front surface is attached to the front surface Wa of the wafer W, and the protective sheet Ws side is suction held by a suction holding surface 62a of the holding table 62. The wafer W is held by the holding table 62 in a state in which the back surface Wb is exposed.

The chamfered portion M is left at the part of the wafer W where the circumferential groove Wm is formed, and the left portion is removed by grinding the wafer W.

In the grinding, while the holding table 62 is rotated, the grindstones 64a of the grinding wheel 64 being rotated are pressed against the back surface Wb of the wafer W, whereby the wafer W is thinned to a predetermined grinding finish thickness Wh.

In this way, the present invention can be realized. In other words, as illustrated in FIGS. 5 to 7, the processing method for a wafer having the chamfered portion M at the peripheral edge Wg includes the preparation step of preparing the cutting apparatus including the holding table 6 for holding the wafer W, the first cutting unit 10 having the first cutting blade 12 for cutting the wafer W held by the holding table 6, and the blade cooler nozzle 15 and the shower nozzle 16 as the first cutting liquid supply nozzles for supplying the cutting liquids 75 and 76 to the first cutting blade 12, and the second cutting unit 20 having the second cutting blade 22 for cutting the wafer W held by the holding table 6, and the blade cooler nozzle 15a and the shower nozzle 16a as the second cutting liquid supply nozzles for supplying the cutting liquids 75a and 76a to the second cutting unit 20, the holding step of holding the wafer W by the holding table 6, and the chamfer removing step of rotating the holding table 6 while causing the first cutting blade 12 to cut into the peripheral edge Wg of the wafer W at least to the grinding finish thickness Wh of the wafer W while supplying the cutting liquids 75 and 76 from the first cutting liquid supply nozzles (the blade cooler nozzle 15 and the shower nozzle 16), to cut the peripheral edge Wg of the wafer W, thereby removing the chamfered portion M in the region reaching to the grinding finish thickness Wh. In the chamfer removing step, the second cutting unit 20 is positioned at a position adjacent to the first cutting unit 10 at such a height that the second cutting blade 22 does not make contact with the wafer W and on the side of the center C of the wafer W as compared to the first cutting unit 10, and the cutting liquids 75a and 76a are supplied from the second cutting liquid supply nozzles (the blade cooler nozzle 15a and the shower nozzle 16a). Thus, the processing method for the wafer W is realized.

According to this method, the cutting liquids 75 and 76 containing the cutting swarf can be effectively prevented from moving toward the center side of the wafer W after jetted in the first cutting unit 10, by the cutting liquids 75a and 76a jetted in the second cutting unit 20 and by the action of rotation of the wafer W. Further, during processing of the chamfer removing step, the front surface wa of the wafer W can be washed by the cutting liquids 75a and 76a jetted in the second cutting unit 20, and firm adhesion of the cutting swarf onto the front surface Wa of the wafer W due to drying of the wafer W can be effectively prevented.

In addition, as illustrated in FIG. 8, a processing method for the wafer W further including a grinding step of grinding the back surface Wb of the wafer W to thin the wafer W to the grinding finish thickness Wh after the chamfer removing step is carried out is realized.

Since the chamfered portion M on the front surface Wa side of the wafer W has been removed before the grinding step, formation of a sharp edge can be prevented.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a wafer having a chamfered portion at a peripheral edge, the processing method comprising:

a preparation step of preparing a cutting apparatus, the cutting apparatus including:

a holding table that holds the wafer, a first cutting unit having a first cutting blade for cutting the wafer held by the holding table, and a first cutting liquid supply nozzle for supplying a cutting liquid to the first cutting blade, and a second cutting unit having a second cutting blade for cutting the wafer held by the holding table, and a second cutting liquid supply nozzle for supplying the cutting liquid to the second cutting blade;

a holding step of holding the wafer by the holding table; and a chamfer removing step of rotating the holding table while causing the first cutting blade to cut into the peripheral edge of the wafer at least to a grinding finish thickness of the wafer while supplying the cutting liquid from the first cutting liquid supply nozzle to cut the peripheral edge of the wafer, thereby removing the chamfered portion in a region reaching the grinding finish thickness, after the holding step is carried out, wherein, in the chamfer removing step, the second cutting unit is positioned at a position adjacent to the first cutting unit at such a height that the second cutting blade does not make contact with the wafer and on the side of a center of the wafer as compared to the first cutting unit, and the cutting liquid is supplied from the second cutting liquid supply nozzle.

2. The processing method according to claim 1, further comprising:

a grinding step of grinding a back surface of the wafer to thin the wafer to the grinding finish thickness, after the chamfer removing step is carried out.

* * * * *